United States Patent [19]

Shimanaka

[11] Patent Number: 5,757,480
[45] Date of Patent: May 26, 1998

[54] METHOD FOR LASER ALIGNMENT IN MASK REPAIR

[75] Inventor: Tetsuya Shimanaka, Tokyo, Japan

[73] Assignee: NEC Corporation, Tokyo, Japan

[21] Appl. No.: 834,417

[22] Filed: Apr. 16, 1997

[30] Foreign Application Priority Data

Oct. 16, 1996 [JP] Japan .................................. 8-273672

[51] Int. Cl.⁶ .................................................. G01B 11/00
[52] U.S. Cl. ........................... 356/237; 356/399; 356/400
[58] Field of Search ................................ 356/399, 400, 356/401, 237, 239, 394; 382/144, 151, 184, 287

[56] References Cited

U.S. PATENT DOCUMENTS 4,388,386  6/1983  King et al. .......................... 356/399
5,648,854  7/1997  McCoy et al. ...................... 356/399

OTHER PUBLICATIONS

"Laser Repair Technology for 256MDRAM Reticle", by T. Haneda et al, NEC Technical Report, vol. 46, No. 12, pp. 13–16, Dec., 1993.

*Primary Examiner*—Hoa Q. Pham
*Attorney, Agent, or Firm*—Whitham, Curtis & Whitham

[57] ABSTRACT

A laser mask repair uses an alignment process comprising the step of normalized pattern matching between a search area encircling a matrix of contact holes including a defective contact hole and reference area encircling a similar matrix of contact holes including a correct contact hole. A slit image is first aligned with the center of the correct contact hole, then shifted to the center of the defective contact hole. The alignment light beam passing through the slit is replaced by a repair laser beam. The defective contact hole is repaired by the laser beam having the slit size equal to the size of the correct contact hole.

9 Claims, 3 Drawing Sheets

METHOD FOR LASER ALIGNMENT IN MASK REPAIR

BACKGROUND OF THE INVENTION (a) Field of the Invention

The present invention relates to a method for laser alignment in a mask repair and, more particularly, to an alignment method capable of accurately aligning a repair laser beam to a defective pattern on a mask.

(b) Description of the Related Art

A mask having fine patterns thereon is generally used for patterning a semiconductor wafer. The pattern on the mask is obtained from an original Cr pattern on a reticle. In this text, the reticle is also referred to as a mask and the description to follow is given mainly to the reticle as an example of the mask.

A laser repair technique is generally used when a defective pattern is found in a reticle. The laser repair technique uses a laser irradiation applied to the defective pattern on the reticle to correct the defect. With the recent progress of the semiconductor technology, minimum line width in the reticle pattern for a 256-Mbit DRAM, for example, is reduced down to 1.0 mm, wherein the allowable error in the line width in the semiconductor wafer is within 0.05 mm. In this situation, the allowable error in the mask repair technique is within 0.10 mm.

A conventional alignment technique for aligning the laser beam to a defective pattern on the reticle for the mask repair is described in, for example, "Laser Repair Technology for 256MDRAM Reticle", by T. Haneda et al., NEC Technical Report, vol. 46, No. 12, pp 13–16, Dec. 1993. The described method is directed to an alignment of the repair laser beam to the defect on a line pattern.

Specifically, the method includes the steps of irradiating a laser beam onto the reticle through a variable slit, imaging the Cr pattern on the reticle by a CCD camera, encoding the image signal to detect the edge of the Cr pattern, and aligning the encoded edge of the laser beam with the encoded edge of the Cr pattern.

However, if the defective Cr pattern to be aligned with the laser beam is not of a straight line but of a contact hole having a significant width, the method as described above cannot be used. In this case, an operator first selects the size of the variable slit to equalize the size of the slit image with the size of the contact hole and then aligns the laser beam with the defective pattern by hand, both while observing the defective contact hole through a microscope. Accordingly, the alignment depends mainly on the skill of the operator, which sometimes involves a failure in the mask repair to damage the reticle pattern. In particular, the digital treatment for recognition of the edge of the defective pattern only allows the edge to be determined by scanning each pixel one by one. In this situation, variation of the illumination may cause misjudgment of the edge to thereby lead to the misalignment of the laser beam with the reticle pattern.

SUMMARY OF THE INVENTION

In view of the foregoing, it is an object of the present invention to provide a method for aligning a laser beam to a defective pattern on a mask with ease and accuracy.

The present invention provides a method for aligning a laser beam with a defective pattern on a mask comprising the steps of imaging a search area including the defective pattern and a reference area including a reference pattern to obtain image data, calculating based on at least the image data first data including a coordinate of a first reference position of the reference pattern and locational relationship between the search area and the reference area, adjusting based on the first data a silt size of a slit for passing an alignment light to obtain a slit image having a second reference position aligned with the first reference position, shifting based on the first data the slit image relative to the mask to align the first reference position with a second reference position of the defective pattern, and replacing the alignment light by a laser beam to irradiate the laser beam to the defective pattern for repairing.

In accordance with the present invention, the center of the slit image of the repair laser beam can be exactly aligned with the center of the location for the defective contact area so that exact mask repair can be obtained independently of the skill of the operator.

The above and other objects, features and advantages of the present invention will be more apparent from the following description, referring to the accompanying drawings.

DESCRIPTION OF THE PREFERRED EMBODIMENTS

Figure 1:
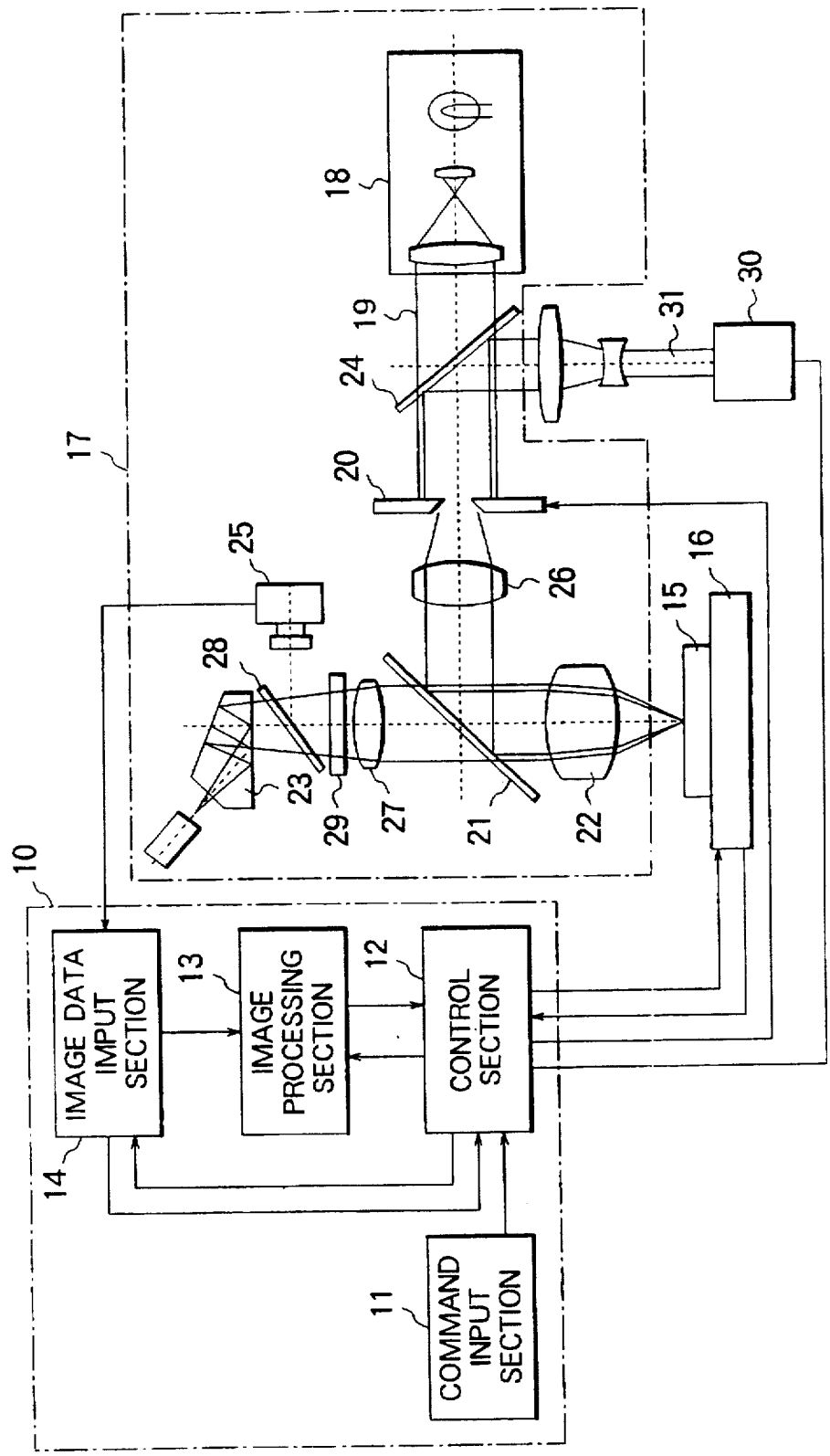
FIG. 1 is a block diagram of a mask repair system implementing a method according to an embodiment of the present invention.

FIG. 1 shows a mask repair system implementing a method according to an embodiment of the present invention. The mask repair system comprises an X-Y stage 16 mounting thereon a reticle 15 under repair by the mask repair system, an alignment optical system 17 for forming a slit image on the reticle 15, an image processing and control block 10, and a repair laser source 30 in association with a lens system for irradiating a repair laser beam 31 onto the reticle 15 through the alignment optical system 17.

The alignment optical system 17 includes a light source 18, a first half mirror 24, a variable slit 20, a first imaging lens 26, a second half mirror 21, and an objective lens 22 consecutively disposed to irradiate an alignment light beam 19 onto the reticle 15. The alignment optical system 17 further comprises an observing and imaging optical system including a second imaging lens 27, an optical filter 29, a third half mirror 28, a CCD camera 25, and a microscope 23 disposed at the rear side of the second half mirror 21 to observe and take an image of the mask pattern on the reticle 15.

The alignment light beam 19 from the light source 18 passes through the variable slit 20 to be reflected by the half mirror 21, and passes through the first imaging lens 26 which corrects the focus of the laser infinite. The observation light beam 19 is then focused by the objective lens 22 to make a slit image on the reticle 15. The reticle 15 is irradiated by another light, not shown in the figure, to provide illumination used in the observation of the mask pattern. The surface of the reticle 15 is observed through the second imaging lens 27 and microscope 23 or imaged by the CCD camera 25 while irradiating the reticle surface by the another light.

The first half mirror 24 disposed between the light source 18 and the variable slit 20 passes the alignment light beam 19 from the light source 18 and also introduces a repair laser beam 31 from the repair laser source 30. The slit image of the alignment light beam 19 formed by the variable slit 20 is exactly aligned with a defective pattern on the reticle 16 under repair by the mask repair system. After this alignment, the repair laser beam 31 is substituted for the alignment light beam 19 with the slit size be maintained, and advances along the same optical path as the alignment light beam 19 to form a slit image of the laser beam on the reticle 15. The slit image of the laser beam can be exactly aligned with the defective pattern. The slit image can be selected to conform to any size of the defective pattern on the reticle by selecting the opening for the variable slit 20. The optical filter 29 protects operator's eye and the CCD camera 25 against the repair laser beam 15.

The image processing and control block 10 includes an image input section 14 for receiving an image data from the CCD camera 25, image processing section 13 for processing the image data received through the image input section 14 by a gray scale image processing, a control section 12 implemented by a personal computer for controlling the operation of the mask repair system based on the data supplied from the image processing section 13, and a command input section 11 implemented by a keyboard or mouse for supplying a command from the operator. The image processing section 13 has a function for calculating the gray scale image data and for matching a pair of patterns in a normalized correlation. The control section 12 receives/supplies data from/to the image processing section 13 and image input section 14 and controls the alignment optical system 17, X-Y stage 16, and repair laser source 30.

Figure 2A:
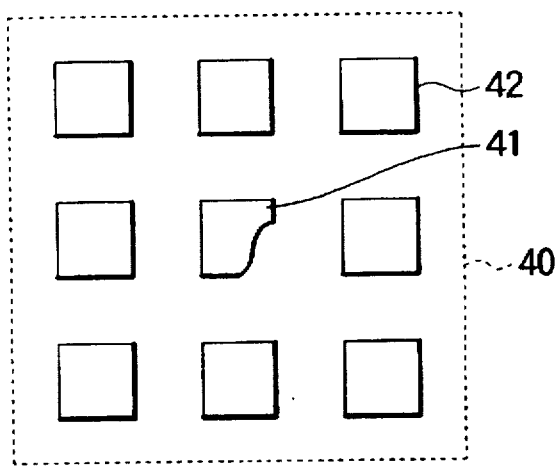
FIGS. 2A and 2B are exemplified schematic plan views of a search pattern and a reference pattern, respectively, obtained by the mask repair system of FIG. 1.
Figure 2B:
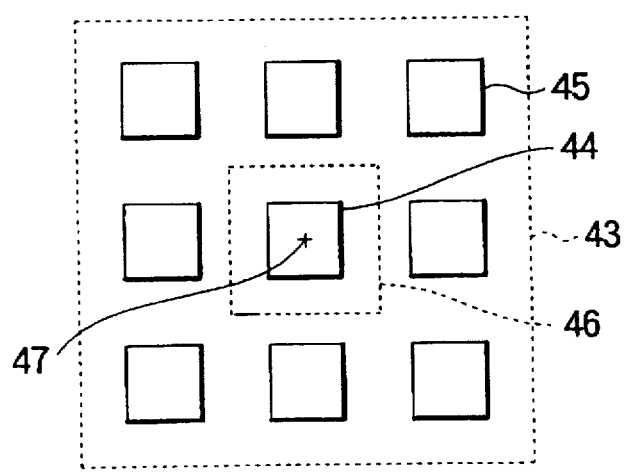

Before alignment by the mask repair system, the operator first determines roughly a search area and a reference area, which are shown in FIGS. 2A and 2B, respectively, on the reticle. The search area 40 includes a defective contact hole 41 and other patterns, such as correct contact holes 42 arrayed in a matrix for surrounding the defective contact hole 41. The search area 40 is defined as a region for executing the search of the defective pattern 41 and determining the location of the defective pattern 41, and is selected by the operator while observing the mask pattern based on the information of the location of the defective pattern 41.

The reference area 43 has the same design configuration as the search area 40 except for the presence of a correct contact hole, referred to as a reference contact hole 44, in the reference area 43 instead of the defective contact hole 41 in the search area 40. Specifically, the reference area 43 includes the reference contact hole 44 and other contact holes 45 arrayed in a matrix for surrounding the reference contact hole 44. The center 47 of the reference contact hole 44 is referred to as a reference point which is used for alignment of the slit image with the reference contact hole 44, as will be described hereinafter. The reference area 43 is selected by the operator on the reticle while observing the mask pattern. After the selection of the search area 40 and the reference area 43, the control section 12 of FIG. 1 actuates the repair system to execute an alignment process for the slit image.

Figure 3:
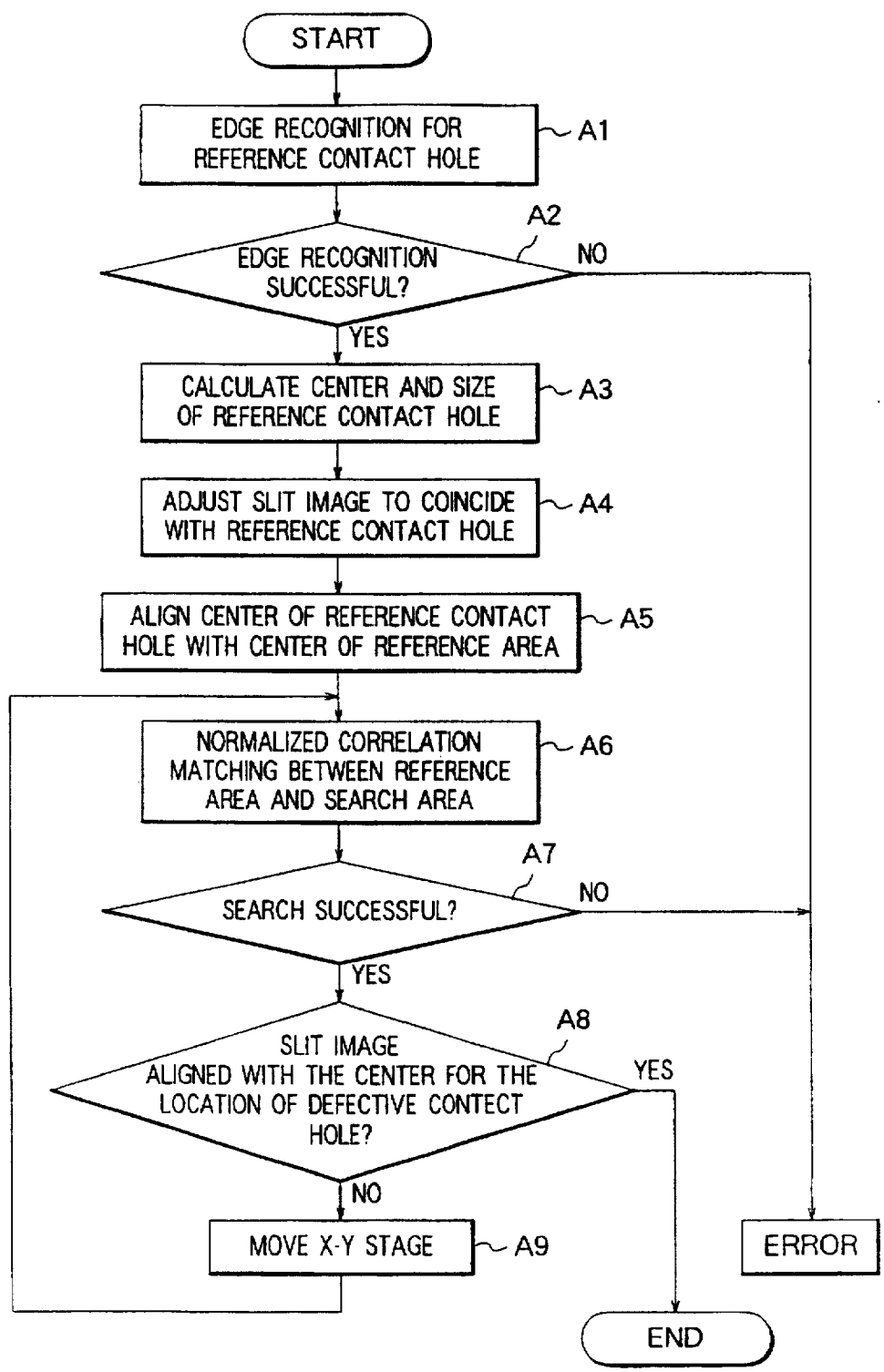
FIG. 3 is a flowchart of a process implemented by the mask repair system of FIG. 1.

FIG. 3 shows a flowchart for alignment of the slit image of the alignment light beam with the defective contact hole executed by the mask repair system of FIG. 1. The mask repair system first recognizes four edges of the reference contact hole 44 in the reference area 43 at step A1 from the image data for the reference area. Considering the thickness of the mask pattern, the reference contact hole on the reticle generally has a three-dimensional structure so that the four edges of the contact hole, in general, cannot be determined in a simple step. The edge recognition is carried out in this embodiment by deciding the brightness or illumination at each pixel in the vicinity of the edge of the reference contact hole, obtaining the grade of the brightness as the vertical slope of edge, interpolating the brightness between each pair of adjacent pixels, selecting candidate points for the edge line which have a certain brightness, and determining the edge line by selecting a plurality of candidate points. By this method, sub-micron order accuracy can be obtained in the edge recognition. If the edge recognition is successful (step A2), the process advances to a next step, whereas if the edge recognition is failed, the repair system is closed for operation while indicating "Error".

After the successful edge recognition of the four edges of the reference contact hole, the size and center of the reference contact hole is determined by calculation from the four edges at step A3. Subsequently, the opening of the variable slit is adjusted so that the slit image on the reticle has the same size and same central location as the reference contact hole has (step A4). The position and size of the slit image can be adjusted by using a calculation. However, in this embodiment, the center of the slit image is also obtained by the edge recognition of the slit image similarly to the edge recognition of the reference contact hole. In this state, the location of the reference area is adjusted so that the center or reference position of the reference area coincides with the center of the contact hole (step A5), as shown in FIG. 2B.

Subsequently, search for patterns in the search area is executed by normalized correlation matching between the reference area and the search area (step A6) to thereby find the accurate center of the location for the defective contact hole which corresponds to the center of the reference contact hole.

In this step, a rectangular region 46 in FIG. 2B including the reference contact hole 44 in the reference area 43 is excluded from the normalized correlation matching. If the search failed to find a pattern configuration in the search area 40 which coincides with the reference pattern configuration in the reference area 43 (step A7), it is impossible to effectively continue the repair operation, and accordingly, the repair system is closed for operation while indicating "Error".

If the search by the normalized correlation matching successfully obtains a pattern configuration which coincides with the reference pattern configuration in the reference area, it means that the center of the defective contact hole can be determined. Then, the X-Y stage is moved at step A9 based on the calculation by subtracting the coordinate of the center of the location for the defective contact hole from the coordinate of the center of the reference contact hole. The normalized correlation matching is further executed at step A6 to examine whether or not the location for the defective contact hole in the search area corresponding to the center of the reference area (or the center of the reference contact hole) is aligned with the center of the slit image by using the edge recognition technique. If it is found that the center of the location of the defective contact hole is aligned with the location of the slit image at step A8, the alignment process is finished.

After the alignment process is finished, the alignment light beam 19 in FIG. 1 is substituted for by the repair laser beam 31, and then mask repair operation is executed by irradiating the slit image of the repair laser beam onto the defective contact hole.

With the mask repair system as described above, the center of the slit image can be exactly aligned with the center of the location for the defective contact hole so that exact mask repair can be obtained independently of the skill of the operator. Since the repair system uses the normalized correlation matching between the reference area including a reference contact hole and the search area including a defective contact hole, the alignment thus obtained is free from the change or variation in the illumination or brightness on the mask pattern. In addition, gray scale image processing for the edge recognition together with the interpolation technique enables calculation between the data for the pixels, thereby providing precise alignment within a sub-pixel order.

In the above embodiment, it may be the case that the center of the location for the defective contact hole cannot be precisely aligned with the center of the slit image due to the limited accuracy in the positioning of the X-Y stage or the like. In this case, an allowable error may be specified beforehand in the alignment between the center of the location for the defective contact hole and the center of the slit image. The alignment operation will be finished after the measured difference between both the centers is found to be within the allowable error range, to enable the alignment within the specified accuracy.

In the above embodiment, an alignment operation for patterns other than the described contact hole can be similarly executed. For example, if the pattern for alignment includes a straight line, both the edges of the straight line and slit image can be detected similarly to the process as described in connection with the contact holes, then aligned together by moving the X-Y table.

Although the present invention is described with reference to a preferred embodiment thereof, the present invention is not limited thereto and it will be apparent from those skilled in the art that various modifications or alterations can be easily made without departing from the scope of the present invention as set forth in the appended claims.

What is claimed is:

1. A method for aligning a laser beam with a defective pattern on a mask comprising the steps of imaging a search area including the defective pattern and a reference area including a reference pattern to obtain first image data, calculating based on at least said first image data including a coordinate of a first reference position of said reference pattern and locational relationship between said search area and said reference area, adjusting based on said first image data a slit size of a slit for passing an alignment light to obtain a slit image having a second reference position aligned with said first reference position, shifting based on said first image data said slit image relative to the mask to align said first reference position with a second reference position of the defective pattern, and replacing said alignment light by a laser beam to irradiate said laser beam to the defective pattern for repairing.

2. A method as defined in claim 1 wherein said calculating step includes the steps of recognizing edges of said reference pattern and calculating the center of said edges as said first reference position.

3. A method as defined in claim 2 wherein said image data is gray scale data.

4. A method as defined in claim 1 wherein both said search area and reference area further include a common pattern configuration having a specific locational relationship relative to the defective pattern or said reference pattern.

5. A method as defined in claim 4 wherein said calculating step includes normalized correlation matching between data for said search area and data for said reference area.

6. A method as defined in claim 1 wherein said second reference position is calculated from edges of said slit image.

7. A method as defined in claim 6 wherein said edges of said slit image is calculated from gray scale image data of said slit image.

8. A method as defined in claim 1 wherein said slit image has a size substantially equal to a size of said reference pattern.

9. A method as defined in claim 1 wherein both the defective pattern and reference pattern are contact holes on a reticle.

* * * * *

UNITED STATES PATENT AND TRADEMARK OFFICE
CERTIFICATE OF CORRECTION

PATENT NO. : 5,757,480
DATED : May 26, 1998
INVENTOR(S) : Shimanaka

It is certified that error appears in the above-identified patent and that said Letters Patent is hereby corrected as shown below:

In column 6, line 2, delete "including".

Signed and Sealed this

Twenty-sixth Day of January, 1999

Attest:

Attesting Officer

Acting Commissioner of Patents and Trademarks